(12) United States Patent
Watanabe

(10) Patent No.: US 10,719,184 B2
(45) Date of Patent: Jul. 21, 2020

(54) TOUCH PANEL AND EXTERNAL CIRCUIT BOARD

(71) Applicant: Mitsubishi Electric Corporation, Tokyo (JP)

(72) Inventor: Kenichi Watanabe, Kumamoto (JP)

(73) Assignee: Mitsubishi Electric Corporation, Tokyo (PA)

( * ) Notice: Subject to any disclaimer, the term of this patent is extended or adjusted under 35 U.S.C. 154(b) by 0 days.

(21) Appl. No.: 16/150,583

(22) Filed: Oct. 3, 2018

(65) Prior Publication Data

US 2019/0129543 A1 May 2, 2019

(30) Foreign Application Priority Data

Oct. 26, 2017 (JP) ................................. 2017-207364

(51) Int. Cl.
*G06F 3/047* (2006.01)
*G06F 3/044* (2006.01)
*H05K 1/18* (2006.01)

(52) U.S. Cl.
CPC .............. *G06F 3/047* (2013.01); *G06F 3/044* (2013.01); *H05K 1/184* (2013.01); *G06F 2203/04103* (2013.01)

(58) Field of Classification Search
CPC ....................................................... G06F 3/047

USPC ......................................................... 345/174
See application file for complete search history.

(56) References Cited

U.S. PATENT DOCUMENTS

| 2010/0163394 | A1 | 7/2010 | Tang et al. | |
|---|---|---|---|---|
| 2010/0214247 | A1 | 8/2010 | Tang et al. | |
| 2012/0098781 | A1* | 4/2012 | Kim | G06F 3/044 345/174 |
| 2018/0120971 | A1* | 5/2018 | Lee | G06F 3/044 |
| 2018/0239476 | A1* | 8/2018 | Yoshida | G02F 1/1345 |

FOREIGN PATENT DOCUMENTS

JP 2010-198615 A 9/2010

* cited by examiner

*Primary Examiner* — Long D Pham
(74) *Attorney, Agent, or Firm* — Studebaker & Brackett PC

(57) ABSTRACT

First and second sensor elements are arranged on a substrate. First sensor-wiring line is connected to the first sensor element. An insulating film covers the first sensor-wiring line. Second sensor-wiring line is connected to the second sensor element and separated from the first sensor-wiring line by the insulating film in the thickness direction. First and second terminal parts are for being connected to an external circuit board, and are provided at an end of the first sensor-wiring line and at an end of the second sensor-wiring line, respectively. First and second lead lines extend from the first and second terminal parts, respectively. The short-circuit wiring line connects the first and second lead lines to each other.

13 Claims, 5 Drawing Sheets

TOUCH PANEL AND EXTERNAL CIRCUIT BOARD

BACKGROUND OF THE INVENTION

Field of the Invention

The present invention relates to a touch panel and an external circuit board.

Description of the Background Art

In a projected-capacitive-type touch panel, sensor-wiring lines (X, Y) on a glass substrate are arranged independently of each other with an insulating film interposed therebetween, and a position is detected by detecting changes in capacitance between the operator's fingertip and the sensor-wiring lines. In a state where an electric circuit or the like is not connected in a manufacturing process of the projected-capacitive-type touch panel configured as described above, the insulating film is sometimes broken by an electrostatic discharge caused by the charged surface of the glass substrate. As a result, the projected-capacitive-type touch panel cannot sense the change in capacitance caused by the contact of the fingertip, which reduces the yield.

Japanese Patent Application Laid-Open No. 2010-198615 discloses a projected-capacitive-type touch panel but does not disclose any countermeasure against static electricity. Therefore, when an electrostatic discharge occurs during the manufacturing process as described above, there is a problem that the insulating film between the sensor-wiring lines (X, Y) is broken.

In order to solve such a problem, a countermeasure can be considered in which, after a flexible printed circuit (FPC) is mounted, all the sensor-wiring lines are connected to the same potential by attaching a conductive tape or the like to the terminals connected to the sensor-wiring lines. However, this countermeasure requires an additional member such as a conductive tape, and requires manpower because it is done manually.

SUMMARY

The present invention has been made to solve the above-mentioned problems, and an object of the present invention is to provide a touch panel in which electrostatic destruction is prevented without attaching an additional member such as a conductive tape or the like for preventing electrostatic destruction.

The touch panel of the present invention is a touch panel used together with an external circuit board. The external circuit board is for supplying a signal to the touch panel. The touch panel has a touch-panel substrate, first and second sensor elements, first and second sensor-wiring lines, an insulating film, first and second terminal parts, and a short-circuit wiring line. The first and second sensor elements are arranged on the substrate. The first sensor-wiring line is connected to the first sensor element. The insulating film covers the first sensor-wiring line. The second sensor-wiring line is connected to the second sensor element and separated from the first sensor-wiring line by an insulating film in the thickness direction. The first and second terminal parts are for being connected to the external circuit board, and are provided at an end of the first sensor-wiring line and at an end of the second sensor-wiring line, respectively. First and second lead lines extend from the first and second terminal parts, respectively. The short-circuit wiring line connects the first and second lead lines to each other.

The touch panel of the present invention can prevent electrostatic destruction without attaching an additional member such as a conductive tape for preventing electrostatic destruction.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
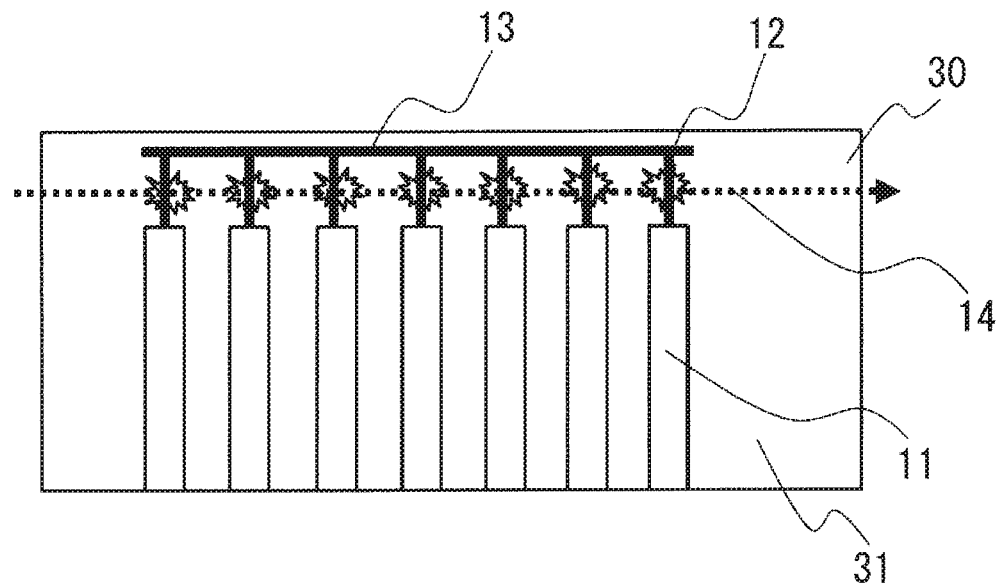
FIG. 1 is an enlarged view of a main part of a projected capacitive touch panel according to a first preferred embodiment of the present invention.

Hereinafter, a preferred embodiment of the present invention will be described with reference to the drawings. In the following description, the same components are denoted by the same reference numerals. Their names and functions are also practically identical. Therefore, detailed description on them is omitted in some cases.

A preferred embodiment of the present invention will be described with reference to the drawings.

Figure 6:
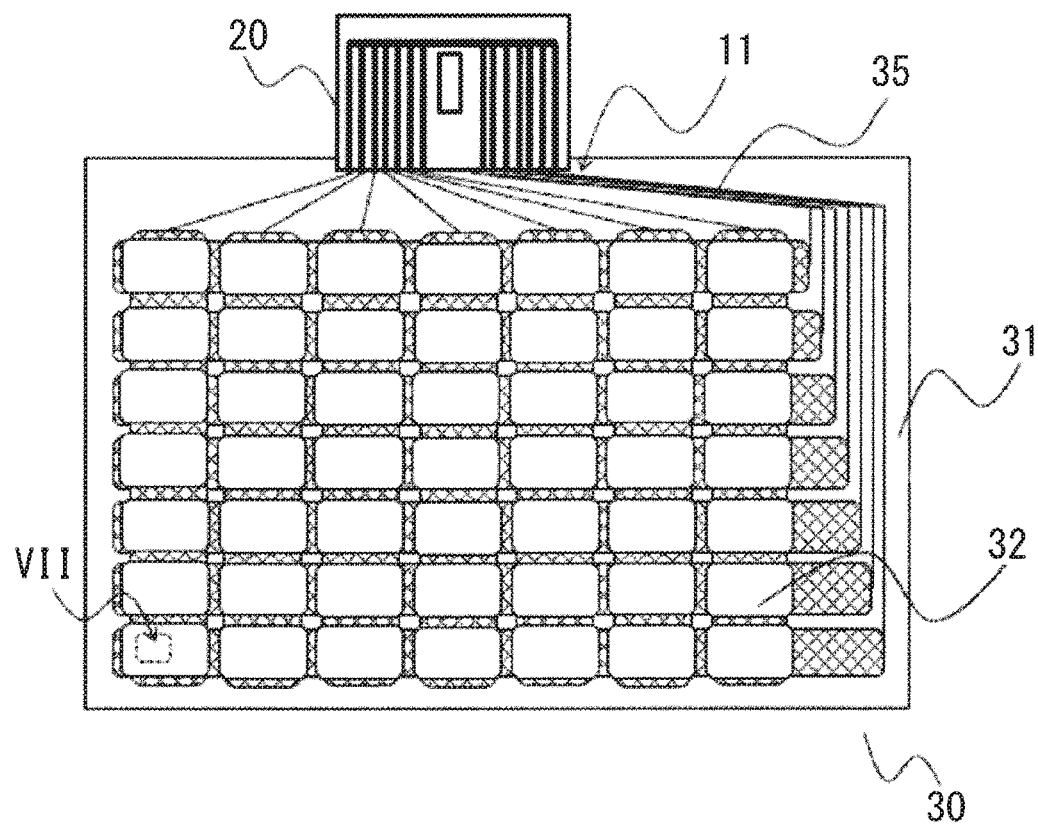
FIG. 6 is a schematic plan view of the whole of a projected capacitive touch panel.

FIG. 6 is a schematic plan view of the whole of a projected capacitive touch panel 30 according to the present preferred embodiment. As shown in FIG. 6, a sensor 32 is provided on a glass substrate 31 (touch-panel substrate). Sensor-wiring lines 35 are connected to the sensor 32. Sensor-wiring lines 35 are connected to terminal parts 11 provided at an end of the glass substrate 31, respectively. Further, an FPC 20 (external circuit board) is connected to the terminal parts 11 of the sensor-wiring lines 35.

Figure 7:
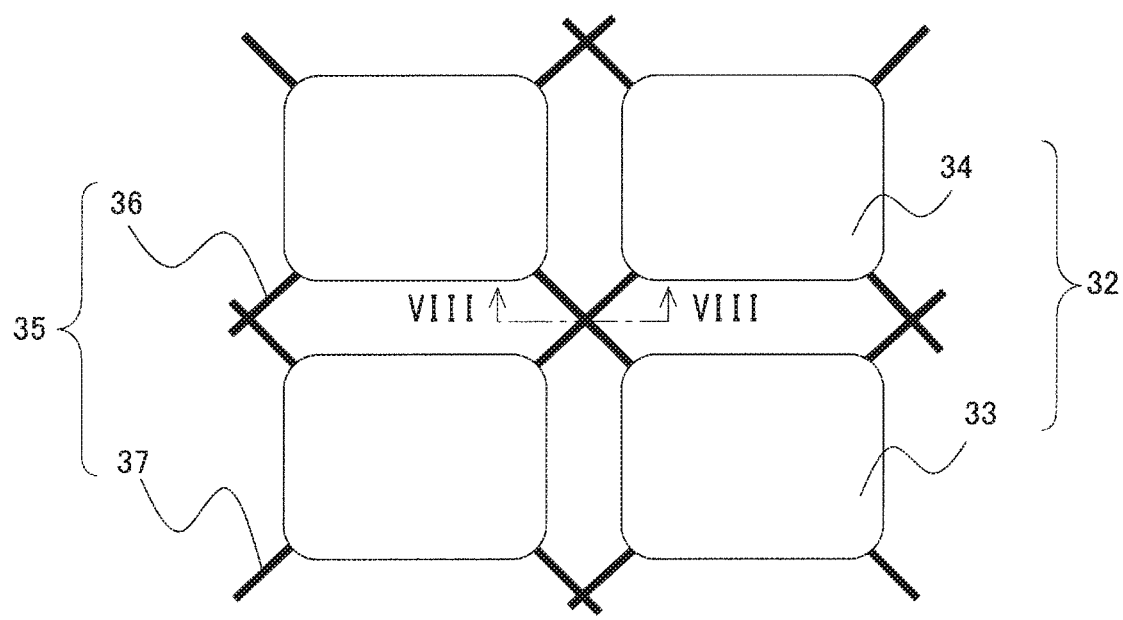
FIG. 7 is an enlarged plan view of a part VII of FIG. 6.
Figure 8:
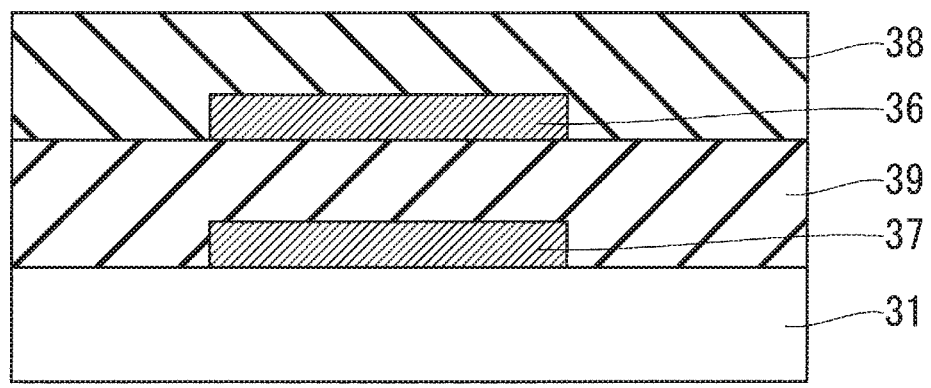
FIG. 8 is a cross-sectional view taken along line VIII-VIII of FIG. 7.

FIG. 7 is an enlarged plan view of a main part of the sensor 32 of the projected capacitive touch panel 30 according to the preferred embodiment. FIG. 8 is a sectional view taken along line VIII-VIII of FIG. 7. As shown in FIG. 7, the sensor 32 is configured with upper-layer sensor elements 33 (second sensor elements) and lower-layer sensor elements 34 (first sensor elements). There are formed upper-layer sensor-wiring lines 36 (second sensor-wiring lines) each connecting the upper-layer sensor elements 33 to each other and lower-layer sensor-wiring lines 37 (first sensor-wiring lines) each connecting the lower-layer sensor elements 34. The above-described sensor-wiring lines (FIG. 6) include upper-layer sensor-wiring lines 36 and lower-layer sensor-wiring lines 37, as shown in FIG. 7. As shown in FIG. 8, on the glass substrate 31, the lower-layer sensor-wiring lines 37 (connected to the lower-layer sensor elements 34) are formed, the upper-layer sensor-wiring lines 36 (connected to the upper-layer sensor elements 33) are formed with an insulating film 39 between the lower-layer sensor-wiring lines 37 and the upper-layer sensor-wiring lines 36, and an insulating film 38 is further disposed. The insulating film 39 covers the lower-layer sensor-wiring lines 37. The upper-layer sensor-wiring lines 36 are separated from the lower-layer sensor-wiring lines 37 by the insulating film 39 in the thickness direction. The terminal parts 11 include ones (second terminal parts) that are provided at ends of the upper-layer sensor-wiring lines 36, and ones (first terminal parts) that are provided at ends of the lower-layer sensor-wiring lines 37.

As described above, in the manufacturing process of the conventional touch panel, when static electricity is caused by the surface of the glass substrate 31 being charged in a state where no electric circuit or the like is connected, the insulating films 38 and 39 are broken, so that a problem may occur, for example, a short circuit is generated between the lower-layer sensor-wiring line 37 (connected to lower-layer sensor elements 34) and the upper-layer sensor-wiring line 36 (connected to the upper-layer sensor elements 33).

Therefore, the configuration in the present preferred embodiment will be described with reference to the drawings as follows. FIG. 1 is an enlarged view of a main part of the projected capacitive touch panel 30 of the present preferred embodiment and shows the vicinity of the terminal parts 11 of the touch panel 30. As shown in FIG. 1, in the touch panel 30 of the present preferred embodiment, lead lines 12 are formed which are connected to the terminal parts 11 on the glass substrate 31 and extend from them, respectively; and a short-circuit wiring line 13 is formed connected to the lead lines 12. The short-circuit wiring line 13 short-circuits the end of one lead line 12 to the ends of the other lead lines 12. The lead lines 12 include ones (second lead lines) extending from the terminal part 11 that are provided at the ends of the upper-layer sensor-wiring lines 36, and ones (first lead lines) extending from the terminal part 11 that are provided at the ends of the lower-layer sensor-wiring lines 37.

According to the present preferred embodiment, the lead lines 12 are connected to the short-circuit wiring line 13 and are set to the same potential. As a result, it is possible to prevent electrostatic destruction that the upper-layer sensor-wiring line or the upper-layer sensor element and the lower-layer sensor-wiring line or the lower-layer sensor element are short-circuited due to static electricity generated on the surface of the glass substrate 31 in a state where no electric circuit or the like is connected during the manufacturing process.

Further, since the terminal parts 11 can be short-circuited to the same potential without an additional member such as a conductive tape, the manufacturing process can be simplified.

In the manufacturing process of the touch panel 30, an inspection is performed on an operation of the touch panel 30 and the like. At the time of inspection, a laser beam is applied to a laser light cutting line 14 (a light irradiation part) set on the lead lines 12 and in the vicinity of the short-circuit wiring line 13. The laser light cutting line 14 is a line for cutting, before the inspection, the parts of the lead lines 12 that are adjacent to the terminal parts 11 off from the short-circuit wiring line 13. The laser light cutting line 14 may be imaginary before laser light application, but the laser light cutting line 14 becomes a line-shaped cutting trace after laser light application. After the short-circuit wiring line 13 is cut, the inspection is performed, and the FPC 20 is connected to the terminal parts 11. After the inspection, electrostatic destruction can be prevented by connecting a control board (not shown) of the touch panel 30.

It is preferable that the width of each lead line 12 (the dimension in the lateral direction in FIG. 1) be smaller than the width of each terminal part 11. The width of the lead line 12 and the width of the terminal part 11 may be the same, which makes it possible to simplify the configuration.

However, when the short-circuit wiring line 13 is configured to connect the lead lines 12 each of which is a line smaller than the terminal part 11, it is possible to prevent the terminal parts 11 from being affected by the above-described application of laser light.

Figure 2:
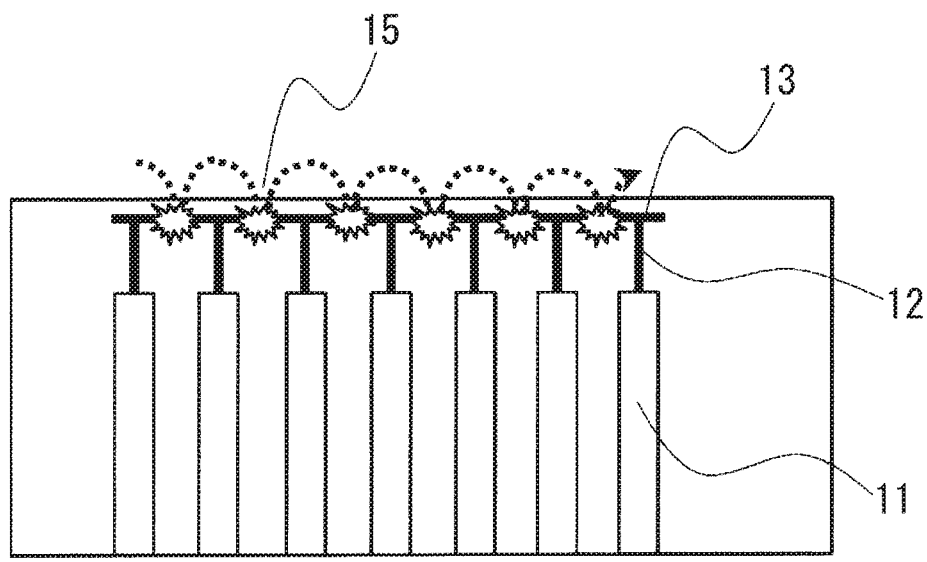
FIG. 2 is an enlarged view of a main part of a projected capacitive touch panel according to a modified example of the first preferred embodiment of the present invention.

A modified example of the present preferred embodiment will be described with reference to FIG. 2. In FIG. 2, it can be said that the short-circuit wiring line 13 is constituted by hypothetical parts connected to each other in the extending direction (the lateral direction in FIG. 2) of the hypothetical parts. Laser light irradiation parts 15 are set on the short-circuit wiring line 13 between adjacent ones of the above-mentioned hypothetical parts. The laser light irradiation parts 15 are light irradiation parts that cut, before the inspection of the touch panel 30 in the product process, between adjacent ones of the parts of the short-circuit wiring line 13. By this cutting, the lead lines 12 are electrically separated from each other. The laser light irradiation parts 15 may be imaginary before laser light irradiation but become cutting traces that cut the short-circuit wiring line 13 after the laser light irradiation. With such a configuration, compared to the configuration of FIG. 1, since the laser light can be applied to positions distant from the terminal parts 11, capacitive coupling with the short-circuit wiring line 13 due to excessive laser output can be prevented, whereby erroneous detection of the touch panel can be prevented.

When the lead lines 12 and the short-circuit wiring lines 13 are formed to have low resistance, there is a possibility of occurrence of an erroneous reaction with another sensor element different from the sensor elements that are connected to the corresponding lead lines 12 and short-circuit wiring line 13. Therefore, in the configuration of FIG. 1, the lead lines 12 and the short-circuit wiring line 13 may be formed using metal nitride, amorphous silicon, or the like. By performing selective etching on the lead lines 12 and short-circuit wiring line 13, the wiring thickness can be changed without increasing the number of masks in the manufacturing process. By changing the wiring resistance by reducing the wiring thickness, the wiring resistance can be increased. By adopting such a configuration, it is not necessary to set the laser light cutting line 14 and to cut the parts of the lead lines 12 that are adjacent to the terminal parts 11 off from the short-circuit wiring line 13. In addition, since the short-circuit state continues even after shipment, electrostatic destruction can be prevented in the long term.

In addition, in the case where laser cutting is omitted by short-circuiting in some degree with the high resistance lines as described above, since the short-circuit state continues even after shipment, it can be expected to prevent electrostatic destruction on the customer side. Also when a line which short-circuits in the lateral direction is provided on the interface side of the FPC connected to the control board (not shown) as in the second preferred embodiment below, the same effect as described above can be obtained until cutting the FPC.

Second Preferred Embodiment

Figure 3:
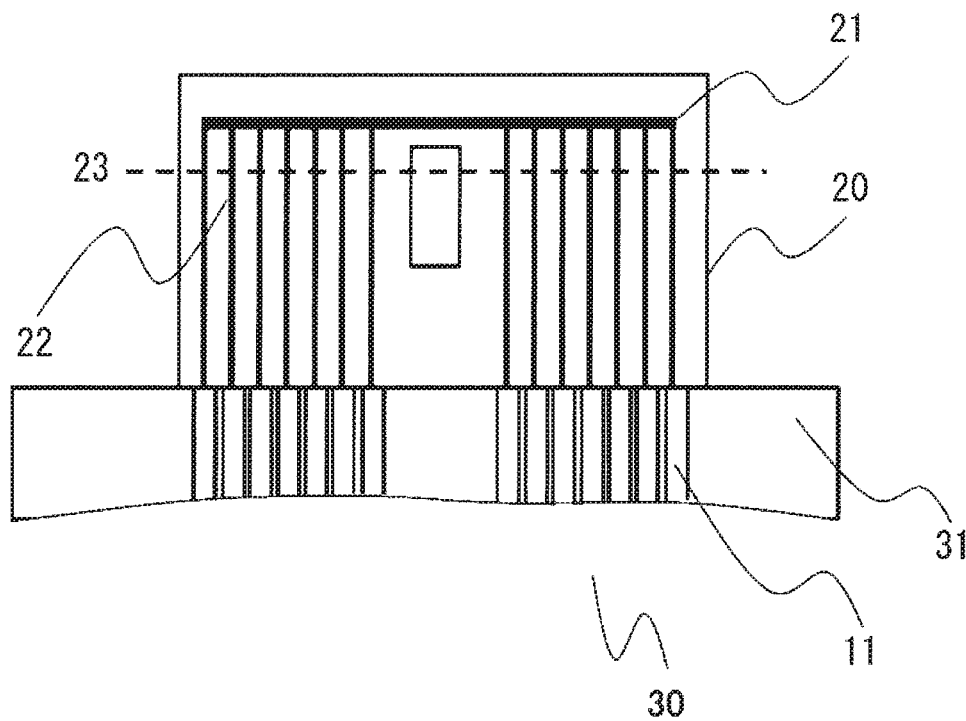
FIG. 3 is an enlarged view of a main part of a projected capacitive touch panel according to a second preferred embodiment of the present invention.

FIG. 3 is a plan view for describing a configuration of the second preferred embodiment. In the drawing, an FPC 20 is arranged at the end of a touch panel 30. The short-circuit wiring line 13 of the first preferred embodiment is formed on a glass substrate 31, but a short-circuit wiring line 21 of the second preferred embodiment is disposed on the FPC 20.

With reference to FIG. 3, the touch panel 30 has the FPC 20 connected to the terminal parts 11. The FPC 20 has wiring lines 22 (lead-wiring lines) connected to the terminal parts 11 on the glass substrate 31. Each of the wiring line 22 has one side (a first side) and the other side (a second side). The wiring lines 22 include ones (second lead-wiring lines) connected to the terminal parts 11 that are provided at the ends of the upper-layer sensor-wiring lines 36, and ones (first lead-wiring lines) connected to the terminal parts 11 that are provided at the ends of the lower-layer sensor-wiring lines 37. On the FPC 20, the short-circuit wiring line 21 is formed at the ends (the second sides) of the wiring lines 22 on the opposite side from the ends (the first sides) connected to the touch panel 30. The wiring lines 22 are short-circuited with each other by the short-circuit wiring line 21. The wiring lines 22 extending from the short-circuit wiring line 21 constitute a comb-shaped wiring-line group. Before an inspection of the touch panel in a manufacturing process, the short-circuit wiring line 21 formed on the FPC 20 is removed by cutting. According to the present preferred embodiment, it is possible to prevent electrostatic destruction which occurs during the manufacturing process, substantially similarly to the first preferred embodiment. Compared to the first preferred embodiment, it is not necessary to form the short-circuit wiring line 13 on the glass substrate 31, so that the manufacturing process of the touch panel 30 can be simplified.

Figure 4:
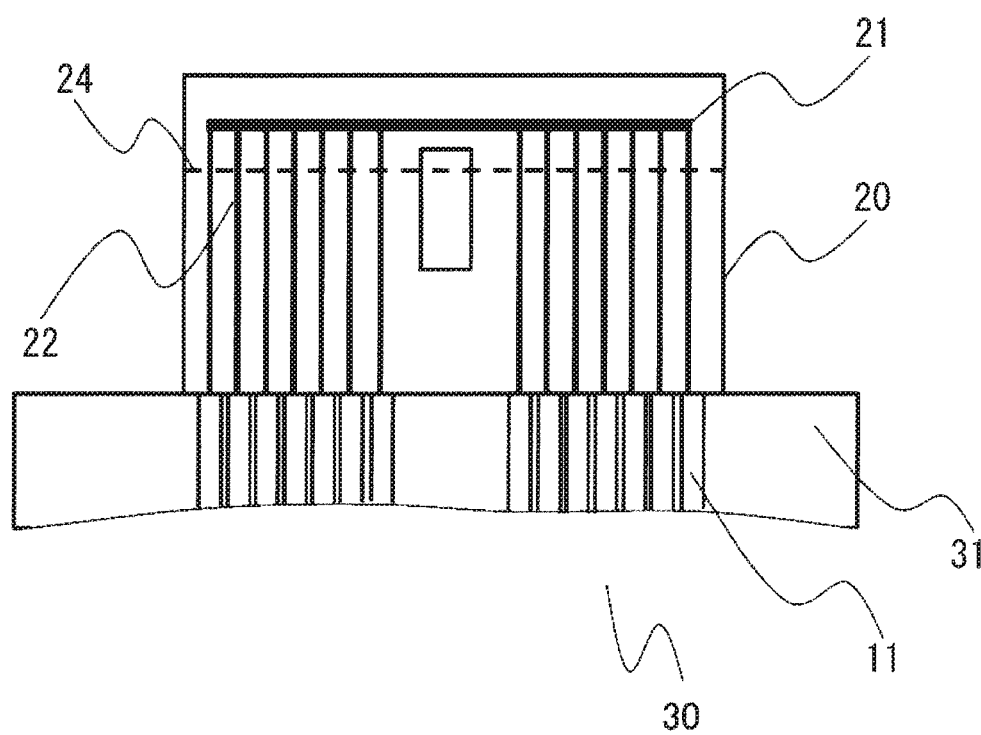
FIG. 4 is an enlarged view of a main part of a projected capacitive touch panel according to a first modified example of the second preferred embodiment of the present invention.

A modified example of the second preferred embodiment will be described with reference to FIG. 4. FIG. 4 is an enlarged view of a main part showing a modified example of the second preferred embodiment. As shown in FIG. 4, according to the modified example, as a structure corresponding to the cutting part 23 of the FPC 20 described above, a printed line 24 is formed. By forming the printed line 24, it is possible to cut the FPC 20 with high accuracy. Therefore, it is possible to maintain a fitting accuracy with a connector (not shown) to be connected to the FPC 20.

Figure 5:
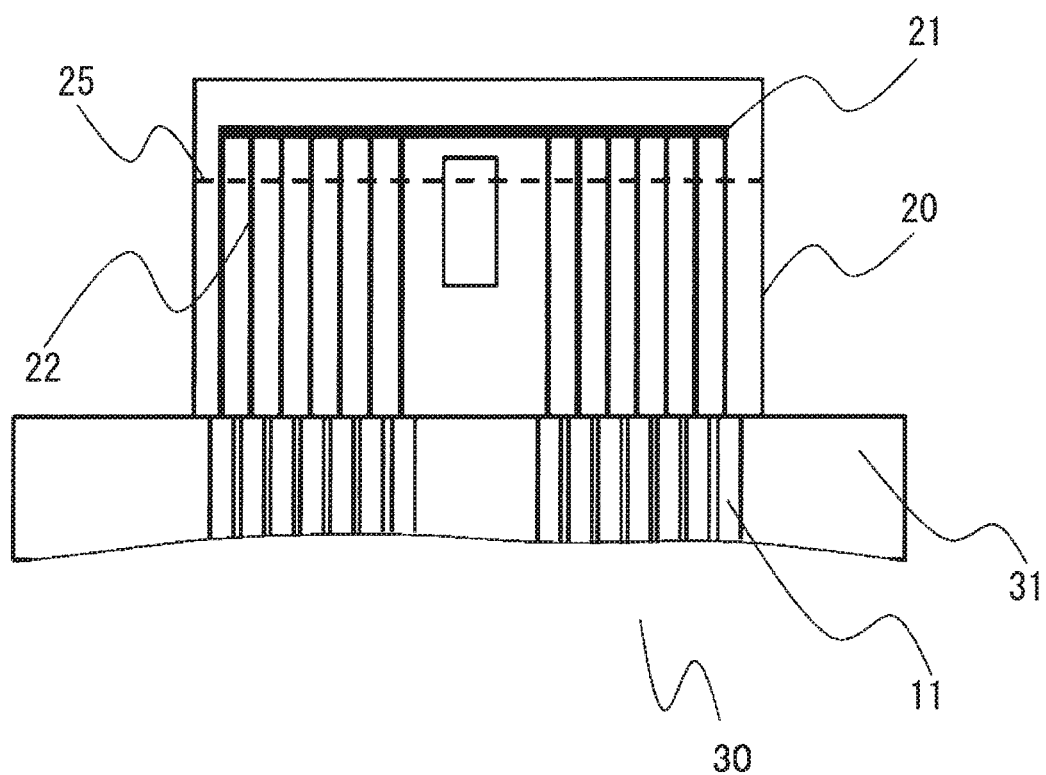
FIG. 5 is an enlarged view of a main part of a projected capacitive touch panel according to a second modified example of the second preferred embodiment of the present invention.

Another modified example of the second preferred embodiment will be described with reference to FIG. 5. FIG. 5 is an enlarged view of a main part showing a modified example of the second preferred embodiment. As shown in FIG. 5, a slit 25 is provided as a structure corresponding to the cutting part 23 of the FPC 20 described in the second preferred embodiment. By weakening the strength of the cutting part, damage to the cutting jig can be prevented, and in addition, the FPC 20 can be used for a long time. In addition, since the FPC 20 can be cut with high accuracy, it is possible to maintain a fitting accuracy with a connector (not shown) to be connected to the FPC 20.

It should be noted that the present invention is not limited to the examples described above, and it goes without saying that various modifications and changes can be made in the material composition, arrangement position, and the like without departing from the configuration of the present invention.

While the invention has been shown and described in detail, the foregoing description is in all aspects illustrative and not restrictive. It is therefore understood that numerous modifications and variations can be devised without departing from the scope of the invention.

What is claimed is:

1. A touch panel for being used together with an external circuit board, the external circuit board supplying a signal to the touch panel, the touch panel comprising:
   a touch-panel substrate;
   a first sensor element and a second sensor element disposed on the touch-panel substrate;
   a first sensor-wiring line connected to the first sensor element;
   an insulating film covering the first sensor-wiring line;
   a second sensor-wiring line connected to the second sensor element and separated from the first sensor-wiring line by the insulating film in a thickness direction;
   first and second terminal parts for being connected to the external circuit board, the first terminal part and the second terminal part being provided at an end of the first sensor-wiring line and at an end of the second sensor-wiring line, respectively;
   first and second lead lines extending from the first and second terminal parts, respectively;
   a short-circuit wiring line connecting the first and second lead lines to each other; and
   one of:
      on the first and second lead lines, irradiation parts for being irradiated with laser light; and
      on the short-circuit wiring line, an irradiation part for being irradiated with laser light to electrically separate the first and second lead lines from each other.

2. The touch panel according to claim 1, comprising the irradiation parts on the first and second lead lines, for being irradiated with the laser light.

3. The touch panel according to claim 2, wherein the irradiation parts have cutting traces which cut the first and second lead lines.

4. The touch panel according to claim 1, comprising the irradiation part on the short-circuit wiring line for being irradiated with the laser light to electrically separate the first and second lead lines from each other.

5. The touch panel according to claim 4, wherein the irradiation part has a cutting trace which cuts the short-circuit wiring line.

6. The touch panel according to claim 1, wherein the first and second lead lines and the short-circuit wiring line include metal nitride or amorphous silicon.

7. The touch panel according to claim 1, comprising the external circuit board having first and second lead-wiring lines connected to the first and second terminal parts of the touch panel, respectively.

8. A touch panel comprising:
   a touch-panel substrate;
   first and second terminal parts provided on the touch-panel substrate; and
   an external circuit board, the external circuit board including:
      first and second lead-wiring lines each of which has a first side and a second side opposite to the first side, the first and second lead-wiring lines being connected to the first and second terminal parts, respectively;

a short-circuit wiring line connecting the second side of the first lead-wiring line and the second side of the second lead-wiring line to each other; and a structure indicating a cutting part for cutting the external circuit board to remove the short-circuit wiring line.

9. The touch panel according to claim 8, wherein the structure is a printed line provided on the external circuit board.

10. The touch panel according to claim 8, wherein the structure includes a slit provided in the external circuit board.

11. An external circuit board for a touch panel having a touch-panel substrate provided with first and second terminal parts, the external circuit board comprising:

first and second lead-wiring lines each of which has a first side and a second side opposite to the first side, the first side of the first lead-wiring line and the first side of the second lead-wiring line being for being connected to the first and second terminal parts of the touch panel, respectively;

a short-circuit wiring line connecting the second side of the first lead-wiring line and the second side of the second lead-wiring line to each other; and a structure indicating a cutting part for cutting the external circuit board to remove the short-circuit wiring line.

12. The external circuit board according to claim 11, wherein the structure is a printed line provided on the external circuit board.

13. The external circuit board according to claim 11, wherein the structure is a slit provided in the external circuit board.

* * * * *